(12) United States Patent
Sato

(10) Patent No.: US 9,565,767 B2
(45) Date of Patent: Feb. 7, 2017

(54) WIRING BOARD FORMED BY A LAMINATE ON A STIFFENER

(71) Applicant: Sony Corporation, Tokyo (JP)

(72) Inventor: Junichi Sato, Oita (JP)

(73) Assignee: Sony Corporation, Tokyo (JP)

( * ) Notice: Subject to any disclaimer, the term of this patent is extended or adjusted under 35 U.S.C. 154(b) by 647 days.

(21) Appl. No.: 13/961,629

(22) Filed: Aug. 7, 2013

(65) Prior Publication Data

US 2014/0054080 A1    Feb. 27, 2014

(30) Foreign Application Priority Data

Aug. 24, 2012 (JP) .................................. 2012-185689

(51) Int. Cl.
| | |
|---|---|
| *H05K 1/11* | (2006.01) |
| *H05K 1/18* | (2006.01) |
| *H05K 3/46* | (2006.01) |
| *H01L 23/13* | (2006.01) |
| *H01L 23/538* | (2006.01) |
| *H05K 3/00* | (2006.01) |
| *H05K 1/02* | (2006.01) |

(Continued)

(52) U.S. Cl.
CPC .............. *H05K 1/184* (2013.01); *H01L 23/13* (2013.01); *H01L 23/5383* (2013.01); *H01L 23/5384* (2013.01); *H01L 23/5389* (2013.01); *H05K 1/183* (2013.01); *H05K 3/4602* (2013.01); *H05K 3/4697* (2013.01); *H01L 23/3128* (2013.01); *H01L 24/73* (2013.01); *H01L 2224/16225* (2013.01); *H01L 2224/32145* (2013.01); *H01L 2224/48227* (2013.01); *H01L 2224/49109* (2013.01); *H01L 2224/73257* (2013.01); *H01L 2224/73265* (2013.01); *H01L 2924/15153* (2013.01); *H01L 2924/15311* (2013.01); *H01L 2924/19105* (2013.01); *H01L 2924/19106* (2013.01); *H05K 1/0271* (2013.01); *H05K 1/141* (2013.01); *H05K 1/181* (2013.01); *H05K 3/007* (2013.01); *H05K 3/0097* (2013.01); *H05K 2201/09127* (2013.01); *H05K 2201/09918* (2013.01); *H05K 2201/10674* (2013.01); *H05K 2203/0228* (2013.01)

(58) Field of Classification Search
CPC ...... H05K 1/184; H05K 1/183; H05K 3/4602; H05K 3/4697; H01L 23/13; H01L 23/5383
USPC ................. 174/266, 250, 255, 260–262, 267
See application file for complete search history.

(56) References Cited

U.S. PATENT DOCUMENTS 8,865,525 B2 * 10/2014 Lin .................... H01L 23/3121
174/261

FOREIGN PATENT DOCUMENTS

| JP | 2011-151348 A | 8/2011 |
| JP | 2011-176020 A | 9/2011 |

* cited by examiner

*Primary Examiner* — Tremesha S Willis
(74) *Attorney, Agent, or Firm* — Chip Law Group

(57) ABSTRACT

There is provided a wiring board including a stiffener bonded to a circuit board, and a laminate formed by laminating a plurality of insulating layers and a plurality of wiring layers on a face of the stiffener opposite to a face bonded to the circuit board. On both faces of the laminate in a laminating direction, terminal connection parts connected to the wiring layers and connected to a terminal part of an electronic component are formed. Further, a component disposition hole, in which the terminal connection parts formed on one of the faces of the laminate are positioned and (Continued)

1 ··· WIRING BOARD
2 ··· LAMINATE
3 ··· STIFFENER
3a ··· COMPONENT DISPOSITION HOLE
4 ··· INSULATING LAYER
5 ··· WIRING LAYER
6 ··· FIRST TERMINAL CONNECTION PART
7 ··· SECOND TERMINAL CONNECTION PART
9 ··· THROUGH HOLE
11 ··· CONNECTION PAD
13 ··· ELECTRONIC COMPONENT
13a ··· TERMINAL PART
15 ··· ELECTRONIC COMPONENT
15a ··· TERMINAL PART
100 ··· CIRCUIT BOARD the electronic component is disposed, and a through hole for connection to the circuit board are formed in the stiffener.

5 Claims, 13 Drawing Sheets

(51) Int. Cl.
*H05K 1/14* (2006.01)
*H01L 23/31* (2006.01)
*H01L 23/00* (2006.01)

1 · · · WIRING BOARD
2 · · · LAMINATE
3 · · · STIFFENER
3a · · · COMPONENT DISPOSITION HOLE
4 · · · INSULATING LAYER
5 · · · WIRING LAYER
6 · · · FIRST TERMINAL CONNECTION PART
7 · · · SECOND TERMINAL CONNECTION PART
9 · · · THROUGH HOLE
11 · · · CONNECTION PAD
13 · · · ELECTRONIC COMPONENT
13a · · · TERMINAL PART
15 · · · ELECTRONIC COMPONENT
15a · · · TERMINAL PART
100 · · · CIRCUIT BOARD

3 · · · STIFFENER
3b · · · NOTCH
7 · · · SECOND TERMINAL CONNECTION PART
9 · · · THROUGH HOLE
11 · · · CONNECTION PAD

3 ··· STIFFENER
3b ··· NOTCH
7 ··· SECOND TERMINAL CONNECTION PART
9 ··· THROUGH HOLE
11 ··· CONNECTION PAD
19 ··· BONDING MATERIAL

3 · · · STIFFENER
3b · · · NOTCH
4 · · · INSULATING LAYER
5 · · · WIRING LAYER
6 · · · FIRST TERMINAL CONNECTION PART
7 · · · SECOND TERMINAL CONNECTION PART
9 · · · THROUGH HOLE
11 · · · CONNECTION PAD

1 · · · WIRING BOARD
2 · · · LAMINATE
3 · · · STIFFENER
3a · · · COMPONENT DISPOSITION HOLE
4 · · · INSULATING LAYER
5 · · · WIRING LAYER
6 · · · FIRST TERMINAL CONNECTION PART
7 · · · SECOND TERMINAL CONNECTION PART
9 · · · THROUGH HOLE

11 · · · CONNECTION PAD
13 · · · ELECTRONIC COMPONENT
13a · · · TERMINAL PART
15 · · · ELECTRONIC COMPONENT
15a · · · TERMINAL PART

1 · · · WIRING BOARD
2 · · · LAMINATE
3 · · · STIFFENER
3a · · · COMPONENT DISPOSITION HOLE
4 · · · INSULATING LAYER
5 · · · WIRING LAYER
6 · · · FIRST TERMINAL CONNECTION PART
7 · · · SECOND TERMINAL CONNECTION PART
9 · · · THROUGH HOLE

11 · · · CONNECTION PAD
13 · · · ELECTRONIC COMPONENT
13a · · · TERMINAL PART
15 · · · ELECTRONIC COMPONENT
15a · · · TERMINAL PART
100 · · · CIRCUIT BOARD

1 · · · WIRING BOARD
2 · · · LAMINATE
3 · · · STIFFENER
3a · · · COMPONENT DISPOSITION HOLE
4 · · · INSULATING LAYER
5 · · · WIRING LAYER
6 · · · FIRST TERMINAL CONNECTION PART
7 · · · SECOND TERMINAL CONNECTION PART
9 · · · THROUGH HOLE

11 · · · CONNECTION PAD
13 · · · ELECTRONIC COMPONENT
13a · · · TERMINAL PART
15 · · · ELECTRONIC COMPONENT
15a · · · TERMINAL PART
100 · · · CIRCUIT BOARD

WIRING BOARD FORMED BY A LAMINATE ON A STIFFENER

BACKGROUND

The present technology relates to the technical field of a wiring board and a manufacturing method of the wiring board. Specifically, the present technology relates to the technical field of achieving miniaturization of a wiring board and reduction of manufacturing cost thereof by forming a laminate on a stiffener in which a component disposition hole in which an electronic component is disposed and a through hole for connection to a circuit board are formed.

Along with the recent speed-up and high performance of electronic components (Integrated Circuit chips, IC chips) used as microprocessors, or the like of a computer, the number of terminals tends to increase and pitches between terminals tend to be narrow. Generally, a large number of terminal parts are provided on the bottom of an IC chip in an array form.

Such terminal parts of an IC chip have a large difference in pitch with respect to connection terminals formed on a circuit board that is called a mother board, and thus it is difficult to mount the IC chip on the mother board.

Thus, in order to connect the IC chip to the mother board, a wiring board that is called a semiconductor package is formed, the IC chip is mounted on (connected to) the wiring board, then the wiring board is mounted on (connected to) the mother board, and thereby the IC chip is connected to the mother board via the wiring board.

As such a wiring board, for example, there is a wiring board that is a so-called cavity substrate that is formed by bonding a main body part formed by laminating a plurality of insulating layers and a plurality of wiring layers using a build-up method on both faces of a core board to a frame-like frame part having component disposition holes in which electronic components are disposed using soldering (refer to Japanese Unexamined Patent Application Publication No. 2011-176020 and No. 2011-151348).

In such a cavity substrate, electronic components are disposed in the component disposition holes so as to be mounted on the main body part, more electronic components are mounted on both faces of the main body part, and thereby, the substrate can be miniaturized in the direction orthogonal to the laminating direction.

SUMMARY

However, in the cavity substrate of the related art described above, as the main body part is bonded to the frame part using soldering, solder resists are formed in the periphery of pads of the main body part to which solder is applied, and also in the periphery of pads of the frame part to which solder is applied.

Thus, by forming the solder resists in the main body part and the frame part, the thickness of the substrate increases accordingly, which hinders miniaturization of a wiring board.

In addition, there is a problem in that a step of forming the solder resists respectively in the main body part and the frame part, and a step of bonding the main body part to the frame part using soldering are necessary, and accordingly, manufacturing cost increases.

It is desirable to provide a wiring board and a manufacturing method of the wiring board that enables miniaturization of a wiring board and reduction of manufacturing cost.

Firstly, a wiring board includes a stiffener bonded to a circuit board, and a laminate formed by laminating a plurality of insulating layers and a plurality of wiring layers on a face of the stiffener opposite to a face bonded to the circuit board. On both faces of the laminate in a laminating direction, terminal connection parts connected to the wiring layers and connected to a terminal part of an electronic component are formed. Further, a component disposition hole, in which the terminal connection parts formed on one of the faces of the laminate are positioned and the electronic component is disposed, and a through hole for connection to the circuit board are formed in the stiffener.

Thus, in the wiring board, the laminate formed by laminating the insulating layers and the wiring layers is formed on the stiffener having the component disposition hole and the through holes.

Secondly, regarding the wiring board, it is preferable that the stiffener is formed in a frame shape.

As the stiffener is formed in a frame shape, an electronic component disposed in the component disposition hole is protected by the stiffener from the outside.

Firstly, a manufacturing method of a wiring board includes bonding two stiffeners in each of which a through hole for connection to a circuit board is formed and between which a bonding material is sandwiched, forming laminates by laminating a plurality of insulating layers and a plurality of wiring layers on respective faces of the respective stiffeners opposite to bonded faces, the laminates each having, on both faces in a laminating direction, a terminal connection part connected to the wiring layers and connected to a terminal part of an electronic component, separating the two stiffeners from each other and removing the bonding material, and separating, from the laminate, part of any of the stiffeners by cutting, and forming a component disposition hole in which the electronic component is disposed.

Thus, according to the manufacturing method of a wiring board, the laminates formed by laminating the insulating layers and the wiring layers are formed on the stiffeners having the component disposition holes and the through holes.

Secondly, regarding the manufacturing method of a wiring board, it is preferable that the stiffeners are each formed in a frame shape.

As the stiffeners are formed in frame shapes, the electronic components disposed in the component disposition holes are protected by the stiffeners from the outside.

Thirdly, regarding the manufacturing method of a wiring board, it is preferable that a notch is formed on a part of a cut spot that is cut during formation of the component disposition hole in the each of the stiffeners.

As the notches are formed on some cut spots of the stiffeners that are cut during the formation of the component disposition holes, the notches are formed in positions connected to the cut spots of the stiffeners.

Fourthly, regarding the manufacturing method of a wiring board, it is preferable that a thermoplastic film is used as the bonding material.

As a thermoplastic film is used as the bonding material, damage or a scratch of the two stiffeners is prevented by the film.

According to an embodiment of the present technology, there is provided a wiring board including a stiffener bonded to a circuit board, and a laminate formed by laminating a plurality of insulating layers and a plurality of wiring layers on a face of the stiffener opposite to a face bonded to the circuit board. On both faces of the laminate in a laminating direction, terminal connection parts connected to the wiring layers and connected to a terminal part of an electronic component are formed. Further, a component disposition hole, in which the terminal connection parts formed on one of the faces of the laminate are positioned and the electronic component is disposed, and a through hole for connection to the circuit board are formed in the stiffener.

Thus, since it is not necessary to separately form the laminate and the stiffener and bond them, and accordingly, solder or a solder resist is not applied between them, miniaturization of the wiring board can be achieved.

In addition, a step of forming a solder resist between the laminate and the stiffener is unnecessary, a step of bonding the laminate to the stiffener using soldering is also unnecessary, and accordingly, reduction of manufacturing cost can be achieved.

According to another embodiment of the present technology, the stiffener is formed in a frame shape.

Thus, as the electronic component disposed in the component disposition hole is protected by the stiffener from the outside, an improvement in reliability of operations of the wiring board can be achieved.

According to another embodiment of the present technology, there is provided a manufacturing method of a wiring board including bonding two stiffeners in each of which a through hole for connection to a circuit board is formed and between which a bonding material is sandwiched, forming laminates by laminating a plurality of insulating layers and a plurality of wiring layers on respective faces of the respective stiffeners opposite to bonded faces, the laminates each having, on both faces in a laminating direction, a terminal connection part connected to the wiring layers and connected to a terminal part of an electronic component, separating the two stiffeners from each other and removing the bonding material, and separating, from the laminate, part of any of the stiffeners by cutting, and forming a component disposition hole in which the electronic component is disposed.

Thus, since it is not necessary to separately form the laminate and the stiffener and bond them, and accordingly, solder or a solder resist is not applied between them, miniaturization of the wiring board can be achieved.

In addition, a step of forming a solder resist between the laminate and the stiffener is unnecessary, a step of bonding the laminate to the stiffener using soldering is also unnecessary, and accordingly, reduction of manufacturing cost can be achieved.

According to another embodiment of the present technology, the stiffeners are each formed in a frame shape.

Thus, as the electronic components disposed in the component disposition holes are protected by the stiffeners from the outside, an improvement in reliability of operations of the wiring board can be achieved.

According to another embodiment of the present technology, a notch is formed on a part of a cut spot that is cut during formation of the component disposition hole in the each of the stiffeners.

Thus, as the notches are formed in the positions connected to the cut spots of the stiffeners, cutting the stiffeners can be performed easily and reliably.

According to another embodiment of the present technology, a thermoplastic film is used as the bonding material.

Thus, damage or scratches of the two stiffeners can be prevented, a satisfactory bonding property of both stiffeners can be secured, and the two stiffeners can be easily bonded to each other using press molding when they are heated.

DETAILED DESCRIPTION OF THE EMBODIMENT(S)

Figure 1:
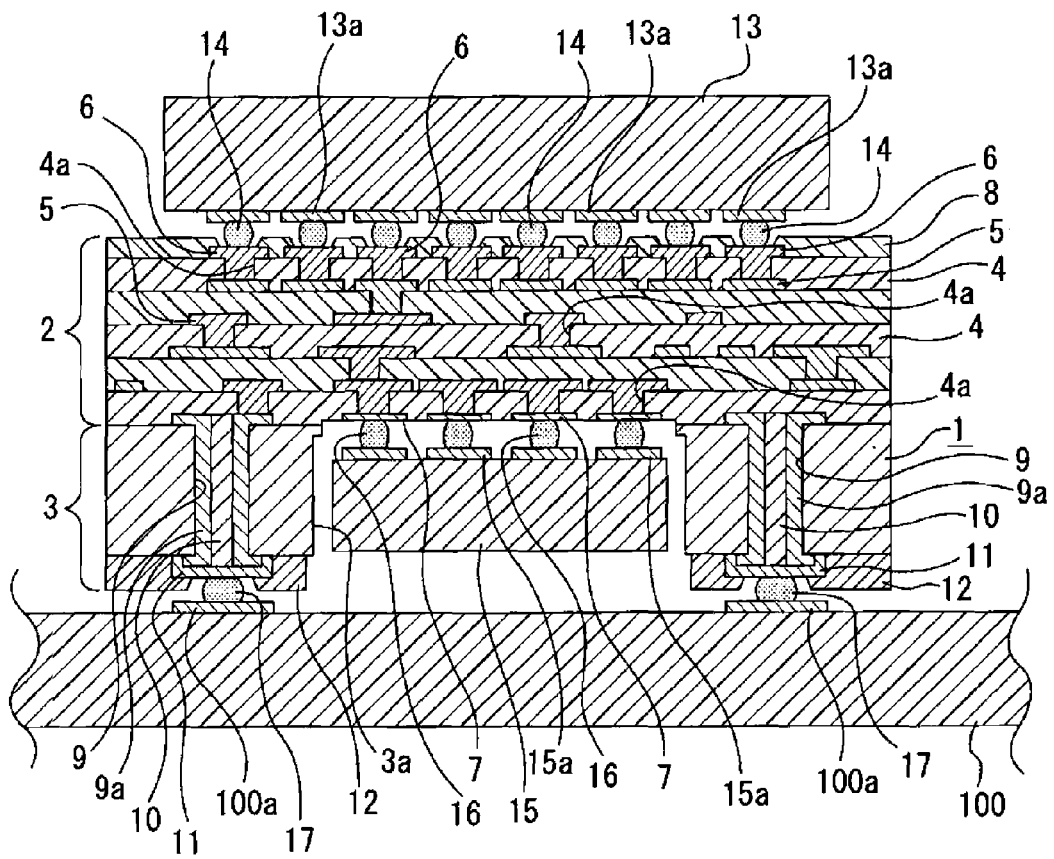
FIG. 1 is an enlarged cross-sectional diagram of a wiring board connected to a mother board, also showing a best embodiment of a wiring board and a manufacturing method of the wiring board according to an embodiment of the present technology along with FIGS. 2 to 13.

Hereinafter, preferred embodiments of the present technology will be described in detail with reference to the appended drawings. Note that, in this specification and the appended drawings, structural elements that have substantially the same function and structure are denoted with the same reference numerals, and repeated explanation of these structural elements is omitted.

Hereinafter, preferred embodiments for implementing a wiring board and a manufacturing method of a wiring board of an embodiment of the present technology will be described with reference to the appended drawings.

A wiring board is a wiring board that is a so-called semiconductor package having a structure with a plurality of laminated layers.

In description below, in a wiring board, front to back, top to bottom, and left to right directions are indicated based on a laminating direction of each part which is set to be the top to bottom direction.

It should be noted that the front to back, top to bottom, and left to right directions shown below are for convenience of description, and the present technology is not limited to the directions when the technology is implemented.

[Configuration of Wiring Board]

Hereinbelow, a configuration of a wiring board 1 will be described (with reference to FIG. 1).

The wiring board 1 has a laminate 2 and a stiffener 3 that is bonded to a lower face of the laminate 2.

The laminate 2 is formed by laminating a plurality of insulating layers 4 and a plurality of wiring layers 5. As a material of the insulating layers 4, for example, an epoxy resin is used, and as a material of the wiring layers 5, for example, copper is used. The wiring layers 5 are connected from an upper layer to a lower layer through predetermined paths.

First terminal connection parts (terminal pads) 6 are formed on the top face of the uppermost insulating layer 4, and second terminal connection parts (terminal pads) 7 are formed on the lower face of the lowermost insulating layer 4. The first terminal connection parts 6 and the second terminal connection parts 7 are connected to the wiring layers 5, and connected to connection terminals of electronic components to be described later. The second terminal connection parts 7 are formed at the center portion of the lowermost insulating layer 4.

Via holes 4a are formed in the insulating layers 4, and a conductive material (copper) fills the via holes 4a to be connected to the wiring layers 5. The via holes 4a are formed by, for example, radiating a YAG (Yttrium Aluminum Garnet) laser, carbon dioxide laser, or the like to the insulating layers 4.

The stiffener 3 comes into contact with the lower face of the lowermost insulating layer 4, is formed of a metallic material having high rigidity, for example, copper, or the like, and is thicker than the insulating layer 4. It should be noted that, as a material of the stiffener 3, for example, a resin material containing glass fiber, carbon fiber, or the like can be used, in addition to a ceramic material.

A solder resist 8 is formed on the top face of the laminate 2 so as to cover the outer periphery of the first terminal connection parts 6.

The stiffener 3 is formed in a rectangular frame shape, and has a component disposition hole 3a penetrating the center portion of the stiffener in the top to bottom direction. The second terminal connection parts 7 are positioned in the component disposition hole 3a.

Through holes 9 for connection to a circuit board (mother board) 100 are formed in the stiffener 3. A cylindrical conduction part 9a that is formed of copper or the like is formed in each of the through holes 9. The conduction parts 9a are connected to the wiring layers 5 formed in the lowermost insulating layer 4.

Filling resins 10 fill the through holes 9 on the inner sides of the conduction parts 9a.

Connection pads 11 are formed on the lower face of the stiffener 3. The connection pads 11 are made to be conductive to the conduction parts 9a formed in the respective through holes 9.

A solder resist 12 is formed on the lower face of the stiffener 3 so as to cover the outer periphery of the connection pads 11.

An electronic component 13 is mounted on the top face of the laminate 2. As the electronic component 13, for example, an IC chip, an SDRAM (Synchronous Dynamic Random Access Memory) having a DDR (Double Data Rate) mode, a memory, a capacitor, or the like is used.

Each electronic component 13 is connected to the laminate 2 through flip-chip connection by bonding terminal parts 13a provided on the lower face of the electronic component to the first terminal connection parts 6 via solders 14.

Another electronic component 15 is disposed in the component disposition hole 3a of the stiffener 3. As the electronic component 15, for example, an IC chip is used.

The electronic component 15 is connected to the laminate 2 through flip-chip connection in which terminal parts 15a provided on the top face of the electronic component are bonded to the second terminal connection parts 7 using solders 16.

In the wiring board 1 on which the electronic components 13 and 15 are mounted as described above, the connection pads 11 formed on the stiffener 3 are bonded to connection terminals 100a of the circuit board 100 through solders 17.

The electronic component 13 is electrically connected to each predetermined circuit formed on the circuit board 100 via the first terminal connection parts 6, the wiring layers 5, the conduction parts 9a, and the connection pads 11. In addition, the electronic component 15 is electrically connected to each predetermined circuit formed on the circuit board 100 via the second terminal connection parts 7, the wiring layers 5, the conduction parts 9a, and the connection pads 11.

It should be noted that, in the wiring board 1, underfill materials which are not shown in the drawing fill the space between the lower face of the electronic component 13 and the top face of the laminate 2, and the space between the top face of the electronic component 15 and the lower face of the laminate 2 to respectively cover the first terminal connection parts 6 and the second terminal connection parts 7. In addition, a heat dissipation plate which is not shown in the drawing is disposed on the top face of the electronic component 13 via a heat transfer material layer, for example, a TIM (Thermal Interface Material), or the like, and thereby heat generated from the electronic component 13 is discharged from the heat dissipation plate.

[Manufacturing Method of Wiring Board]

Next, a manufacturing method of the above-described wiring board 1 will be described (with reference to FIGS. 2 to 11).

Figure 2:
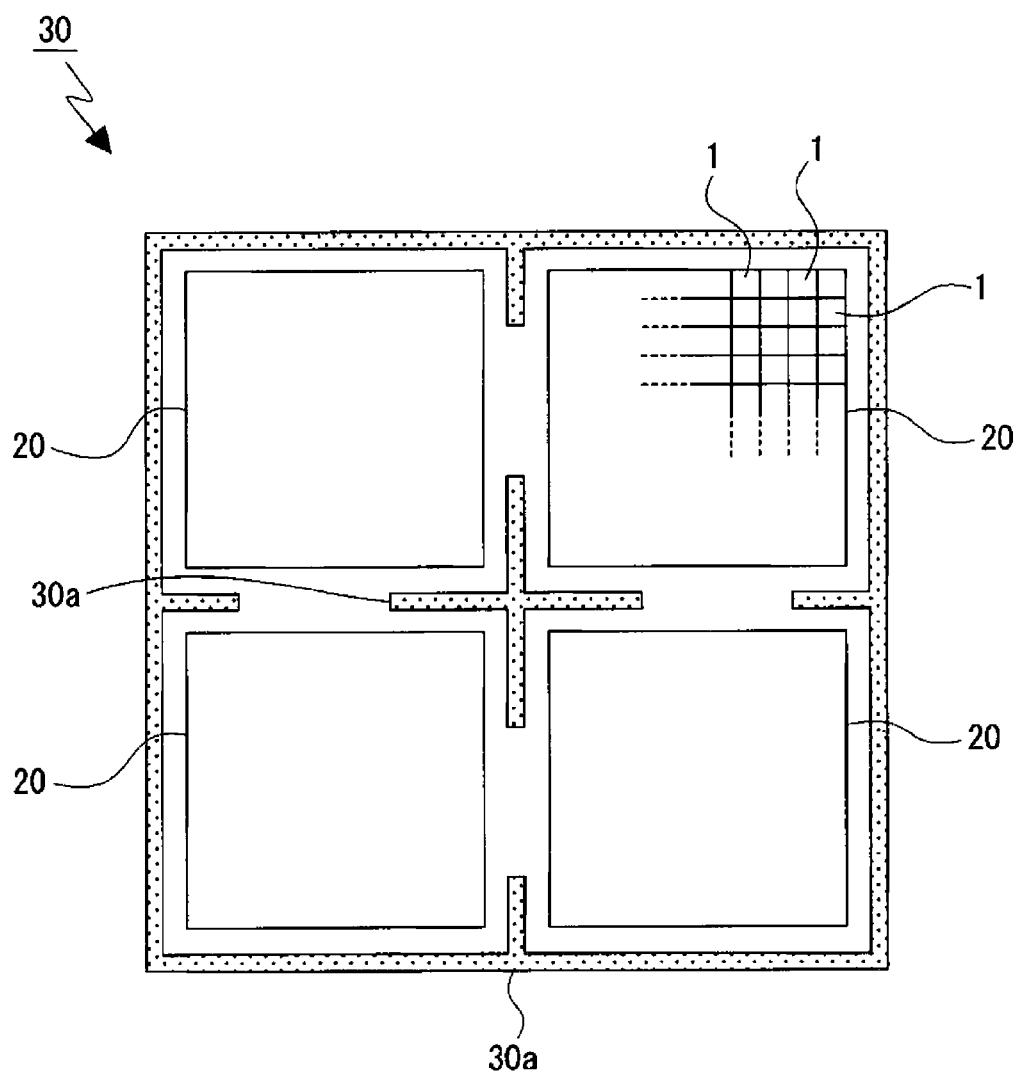
FIG. 2 is a conceptual diagram showing a molded body, also showing the manufacturing method of a wiring board along with FIGS. 3 to 11.

It should be noted that wiring boards 1 are formed by being cut off and separated from a plurality of product parts 20 through respective routing as shown in FIG. 2. For example, 48 wiring boards 1 are formed from one product part 20, and the plurality of product parts 20 are formed by being cut out from a molded body 30. The molded body 30 has adhesion parts 30a (the portions indicated by flecked regions in the drawing) formed in portions between the outer peripheral portion and the product parts 20.

In this manner, a sufficient space for the adhesion parts 30a can be secured by forming the molded body 30 in a large size to form the wiring boards 1, and accordingly, manufacturing cost of the wiring boards 1 can be lowered.

The wiring boards 1 are formed by being cut off and separated from the product parts 20 cut out from the molded body 30 formed by laminating each part (each layer) as described above, but hereinbelow, description of manufacturing the entire molded body 30 will be omitted, and manufacturing only the portion to be formed as the wiring boards 1 will be described.

Figure 3:
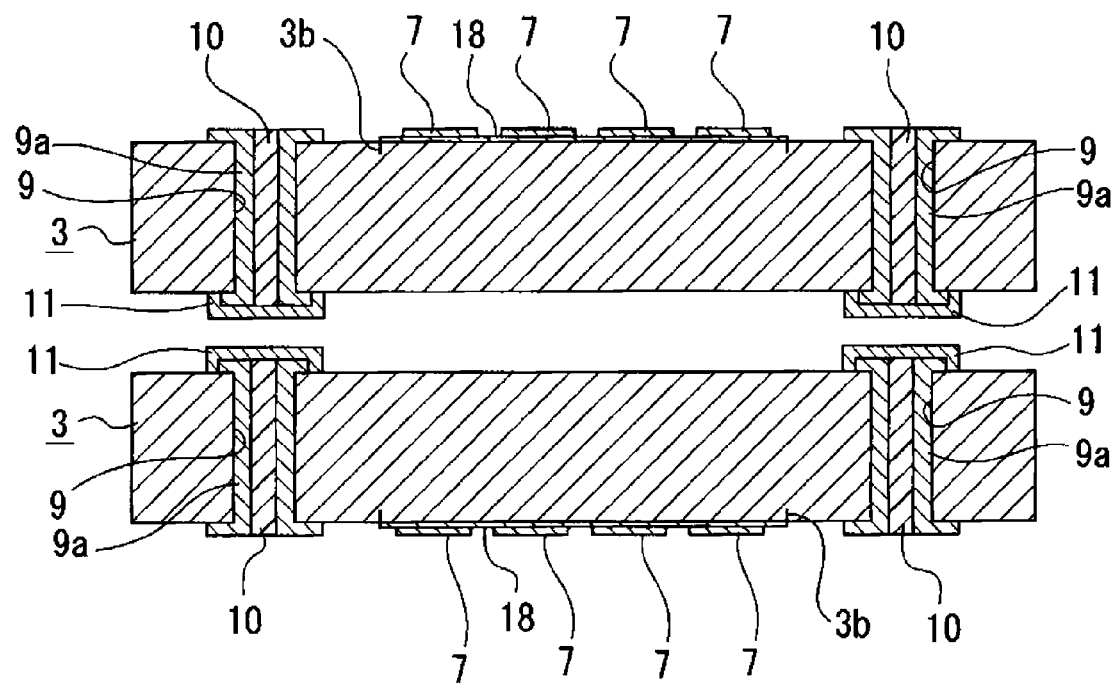
FIG. 3 is an enlarged cross-sectional diagram showing a state in which two stiffeners are prepared.

First, stiffeners 3 are prepared (refer to FIG. 3). Through holes 9 are formed in each stiffener 3, and conduction parts 9a are respectively formed in the through holes 9. In addition, second terminal connection parts 7 are formed on one face of each stiffener 3 by, for example, being bonded thereto using low melting-point solders 18.

In the stiffeners 3, notches 3b are formed at the locations of outer circumferences of the low melting-point solders 18.

It should be noted that the through holes 9 are formed in each of the stiffeners 3 by excavation using, for example, a drill.

The first stiffeners 3 and 3 are disposed so as to face the faces opposite to the faces on which the second terminal connection parts 7 are formed.

Figure 4:
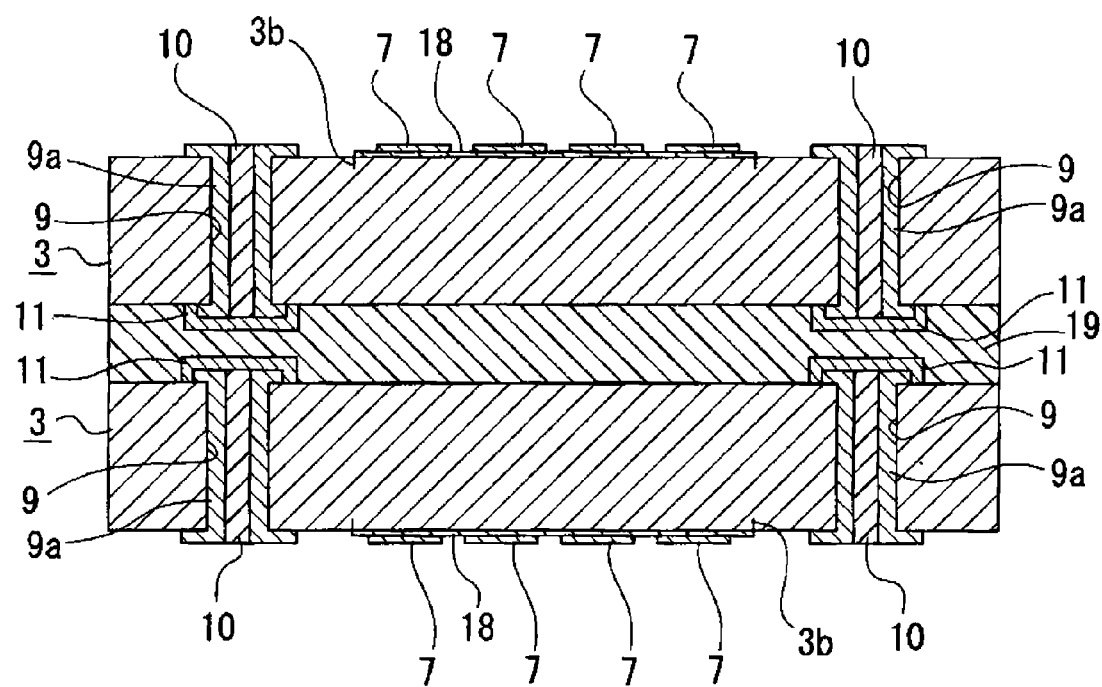
FIG. 4 is an enlarged cross-sectional diagram showing a state in which the stiffeners are bonded to each other with a bonding material sandwiched therebetween.

Next, the stiffeners 3 and 3 are bonded to each other using a bonding material 19 such as a thermoplastic film sandwiched therebetween (stiffener bonding step) (refer to FIG. 4). The bonding of the first stiffeners 3 and 3 using the bonding material 19 sandwiched therebetween is performed through press molding (thermocompression bonding).

By using a thermoplastic film as the bonding material 19, damage or scratches of the first stiffeners 3 and 3 can be prevented, a satisfactory bonding property of both stiffeners can be secured, and the stiffeners 3 and 3 can be easily bonded to each other using press molding when they are heated.

Figure 5:
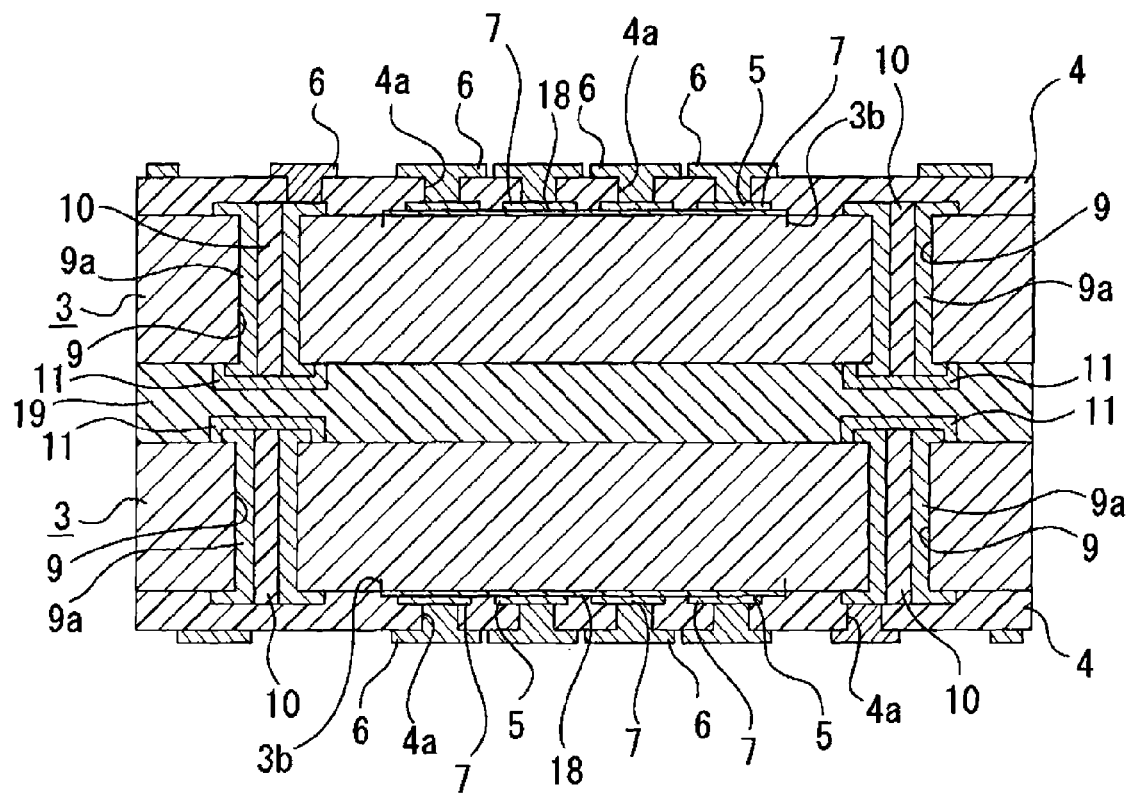
FIG. 5 is an enlarged cross-sectional diagram showing a state in which a part of a laminate is formed on each of the stiffeners.
Figure 6:
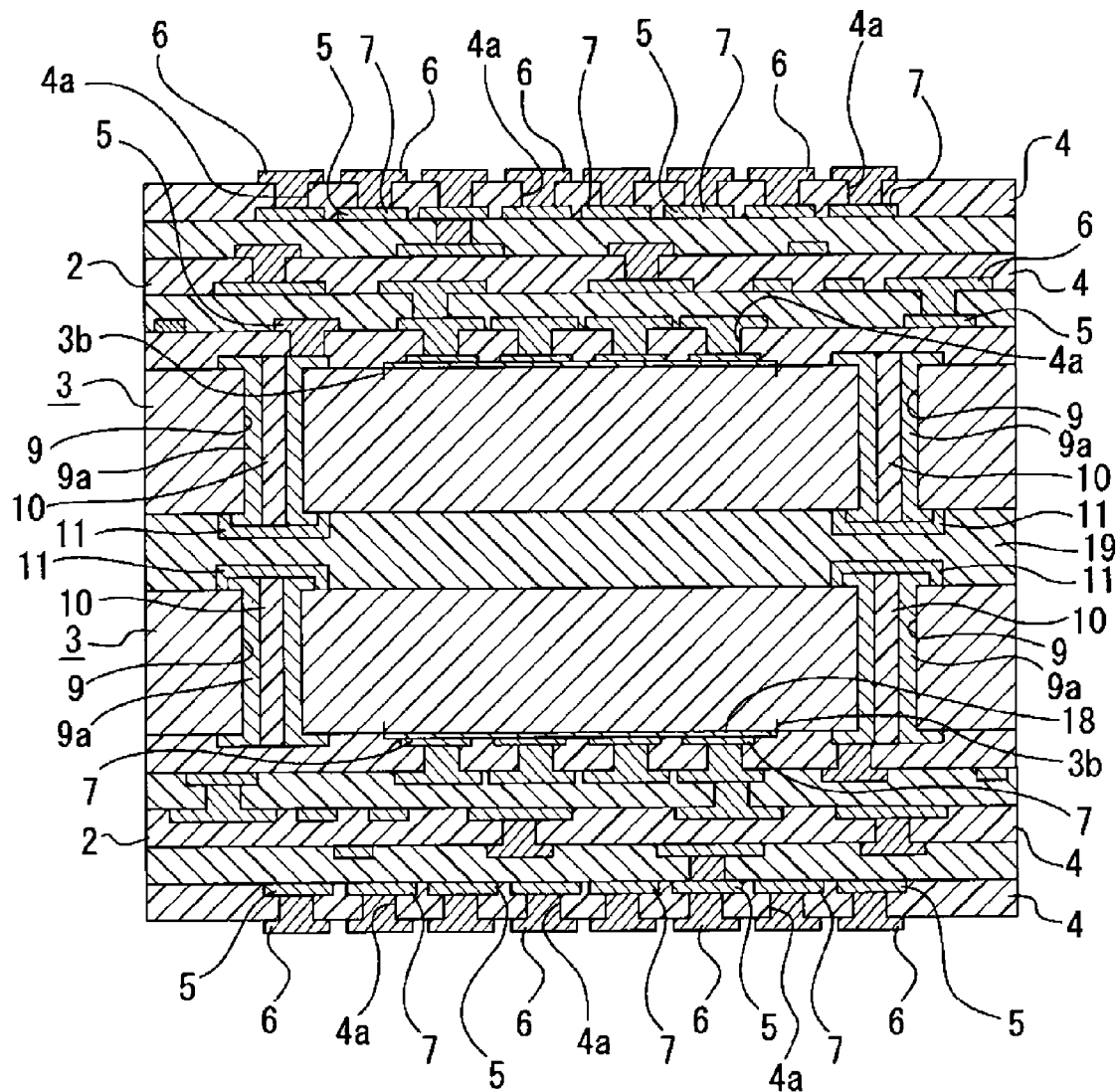
FIG. 6 is an enlarged cross-sectional diagram showing a state in which one of the laminates is formed on each of the stiffeners.

Next, laminates 2 are formed by sequentially laminating a plurality of insulating layers 4 and a plurality of wiring layers 5 on the faces opposite to the faces of the stiffeners 3 and 3 being bonded to each other (laminate forming step) (refer to FIGS. 5 and 6).

At this moment, there is a possibility of occurrence of warping due to a difference in linear expansion coefficients of the stiffeners 3 and 3 and the laminates 2 and 2, but warping occurs in the upper laminate 2 and the lower laminate 2 in opposite directions, and thereby the occurrence of warping is suppressed as a whole.

Since the laminates 2 and 2 are formed by laminating each of layers on the bonded stiffeners 3 and 3, rigidity is high when the stiffeners 3 and 3 are provided, and initial warping at a normal temperature can be suppressed.

Figure 7:
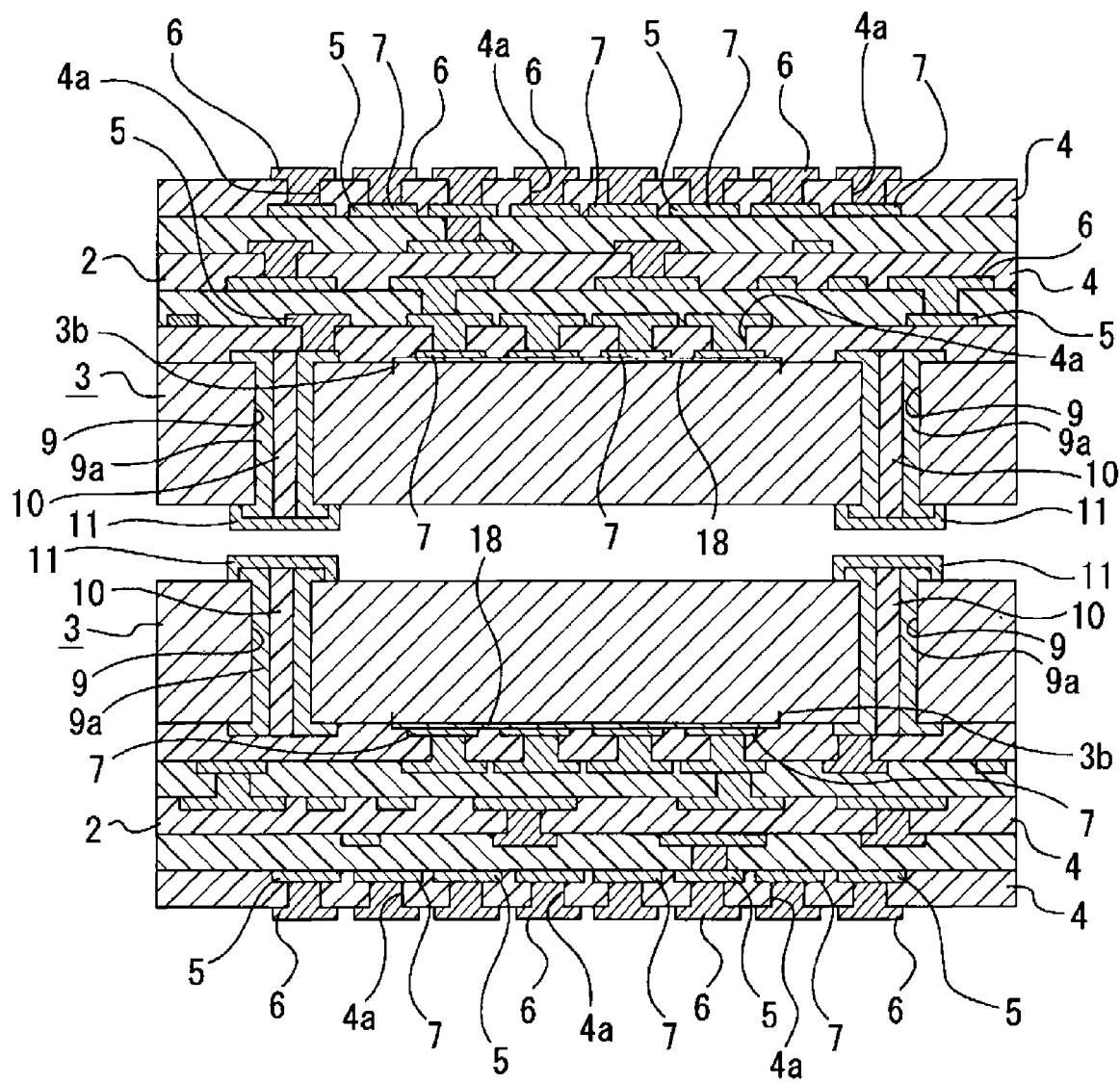
FIG. 7 is an enlarged cross-sectional diagram showing a state in which the stiffeners are peeled and separated from each other, and the bonding material is removed.

Next, the stiffeners 3 and 3 are detached and separated from each other, and the bonding material 19 is thereby removed (separation step) (refer to FIG. 7).

Figure 8:
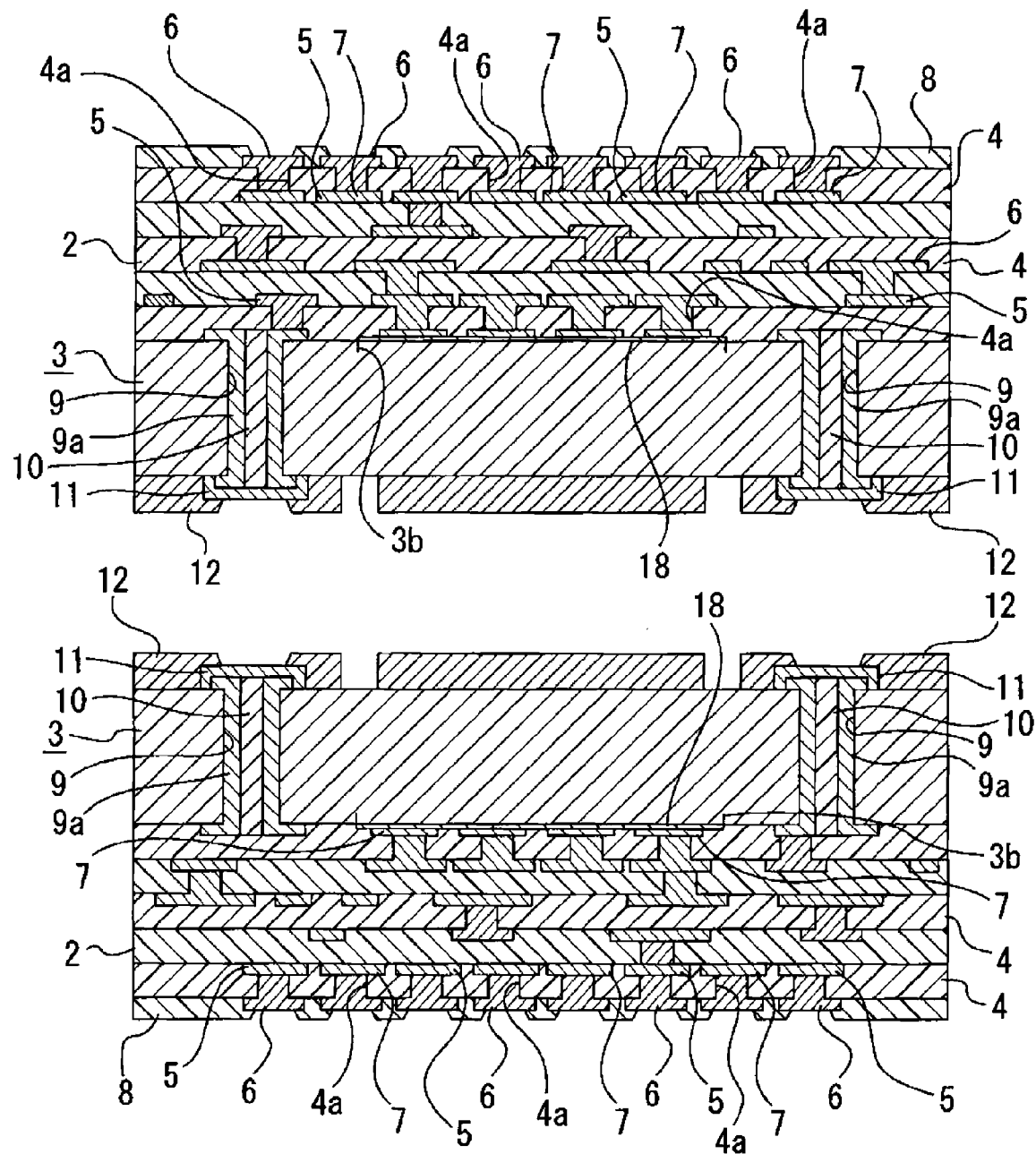
FIG. 8 is an enlarged cross-sectional diagram showing a state in which solder resists are formed in the stiffeners.

Subsequently, solder resists 8 and 8 are formed in the stiffeners 3 and 3 so as to cover the outer peripheral portions of the first terminal connection parts 6, and the solder resists 12 and 12 are formed in the stiffeners 3 and 3 to cover the outer peripheral portions of the second terminal connection parts 7 (refer to FIG. 8).

Figure 9:
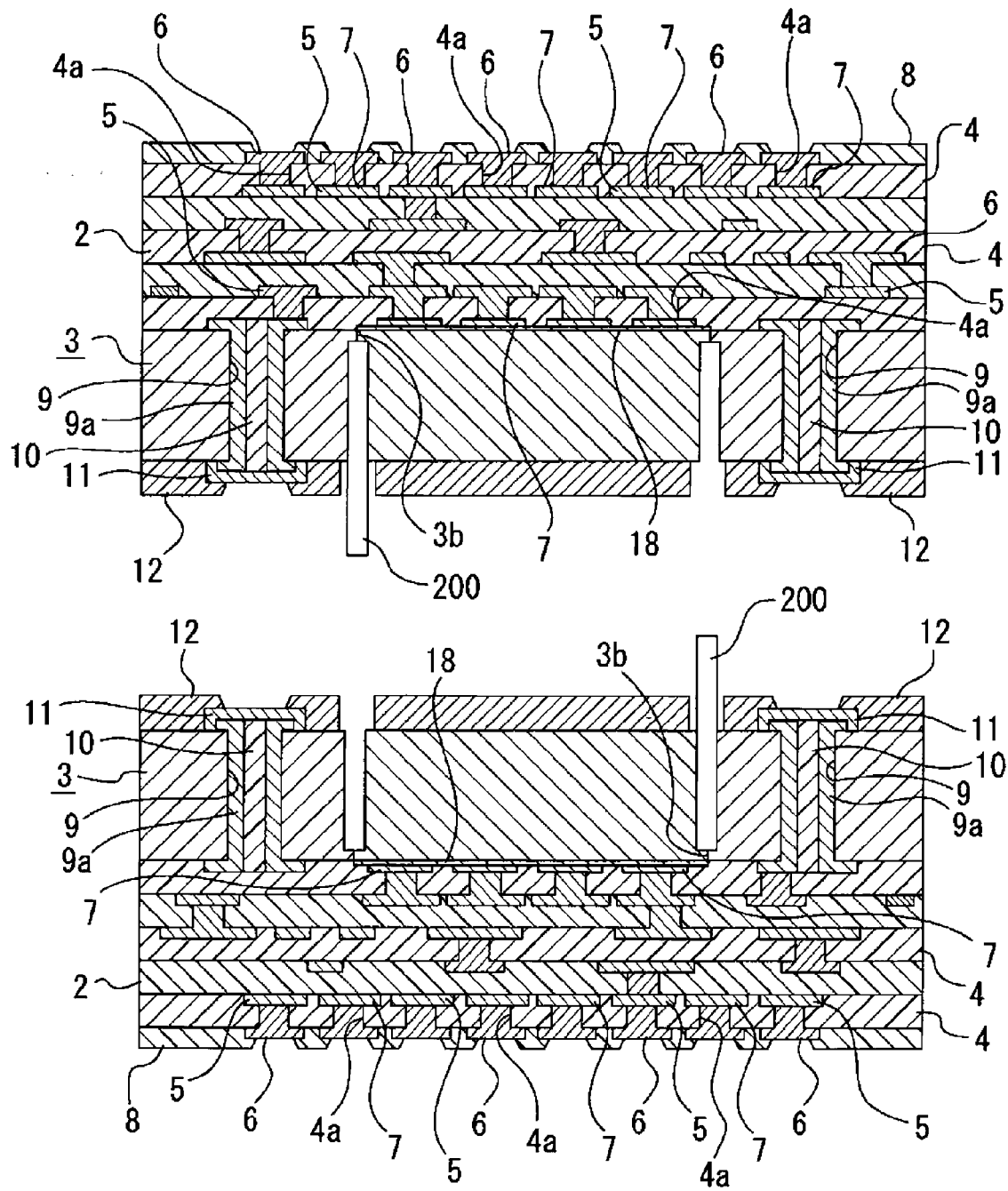
FIG. 9 is an enlarged cross-sectional diagram showing a state in which the stiffeners are cut.

Next, the stiffeners 3 and 3 are cut using routers 200 and 200 (refer to FIG. 9). At this moment, since the notches 3b and 3b that are formed in the stiffeners 3 and 3 beforehand are formed at positions connected to the cut positions of the stiffeners 3 and 3 by the routers 200 and 200, cutting of the stiffeners 3 and 3 by the routers 200 and 200 can be performed easily and reliably.

Figure 10:
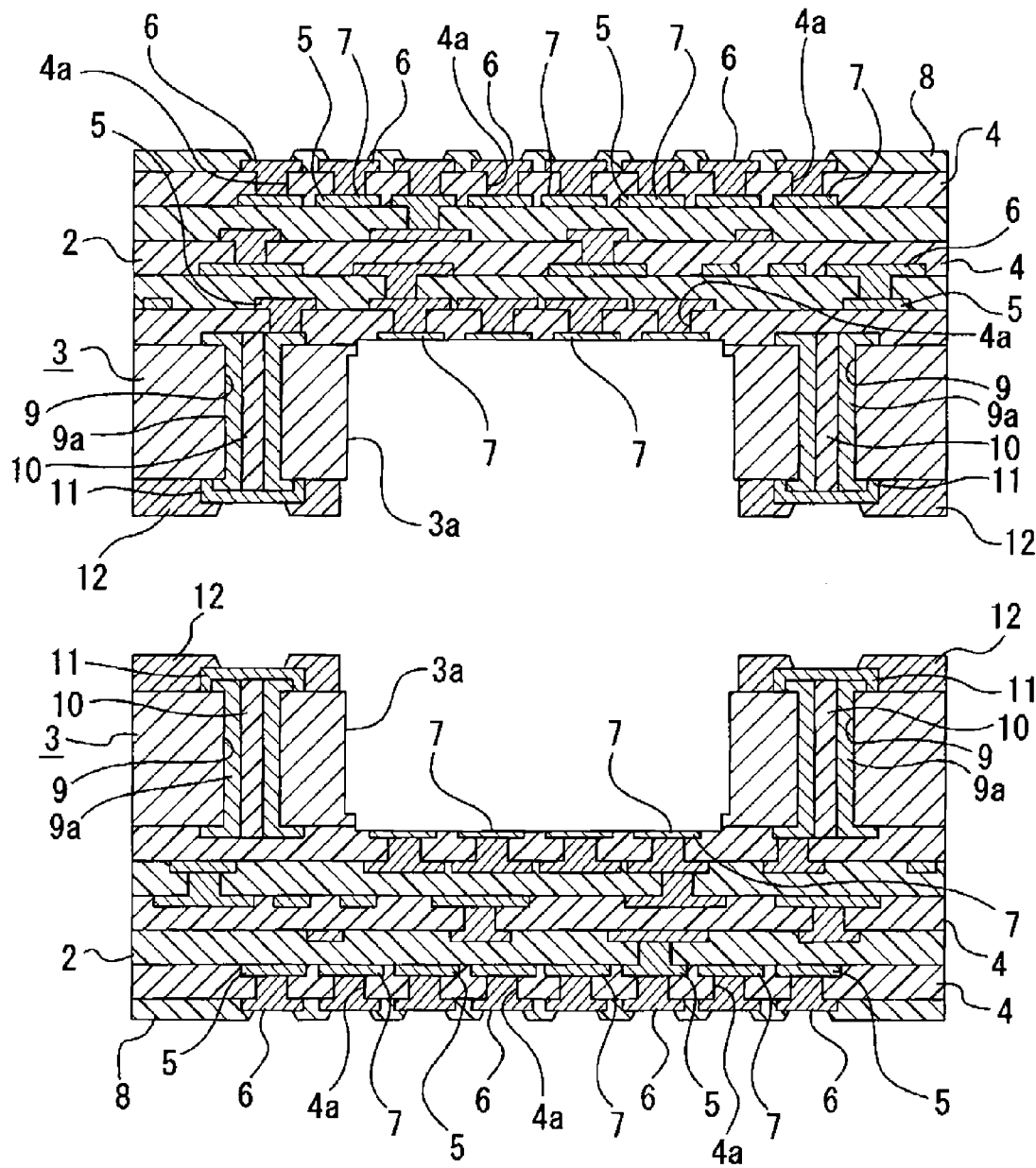
FIG. 10 is an enlarged cross-sectional diagram showing a state in which parts of the stiffeners are detached from the laminates to form disposition holes, and thereby wiring boards are formed.

During the cutting of the stiffeners 3 and 3 by the routers 200 and 200, the component disposition holes 3a and 3a are formed in such a way that the low melting-point solders 18 and 18 are melted at a high temperature, and then parts of the stiffeners 3 and 3 are detached from the laminates 2 (disposition hole forming step) (refer to FIG. 10). By forming the component disposition holes 3a and 3a, the terminal connection parts 7 are exposed.

In this manner, the wiring boards 1 and 1 are manufactured in such a way that the low melting-point solders 18 and 18 are melted, the parts of the stiffeners 3 and 3 are detached from the laminates 2, the component disposition holes 3a and 3a are formed, and thereby the terminal connection parts 7 are exposed.

It should be noted that, although the example in which the low melting-point solders 18 are melted, the parts of the stiffeners 3 are detached from the laminates 2, and then the component disposition holes 3a are formed has been described above, each part of the stiffener 3 can be detached from each laminate 2 by forming, for example, a malleable alloy layer of SnBi, AuSn, or the like, on the surface of the stiffener 3, and then breaking this alloy layer during the cutting of the stiffener 3 by the router 200.

In addition, if a partially processed face using an element of fluorine, silicon, or the like is formed on the surface of the stiffener 3, the part of the stiffener 3 on the processed face can be detached from the laminate 2 during the cutting of the stiffener 3 by the router 200.

Figure 11:
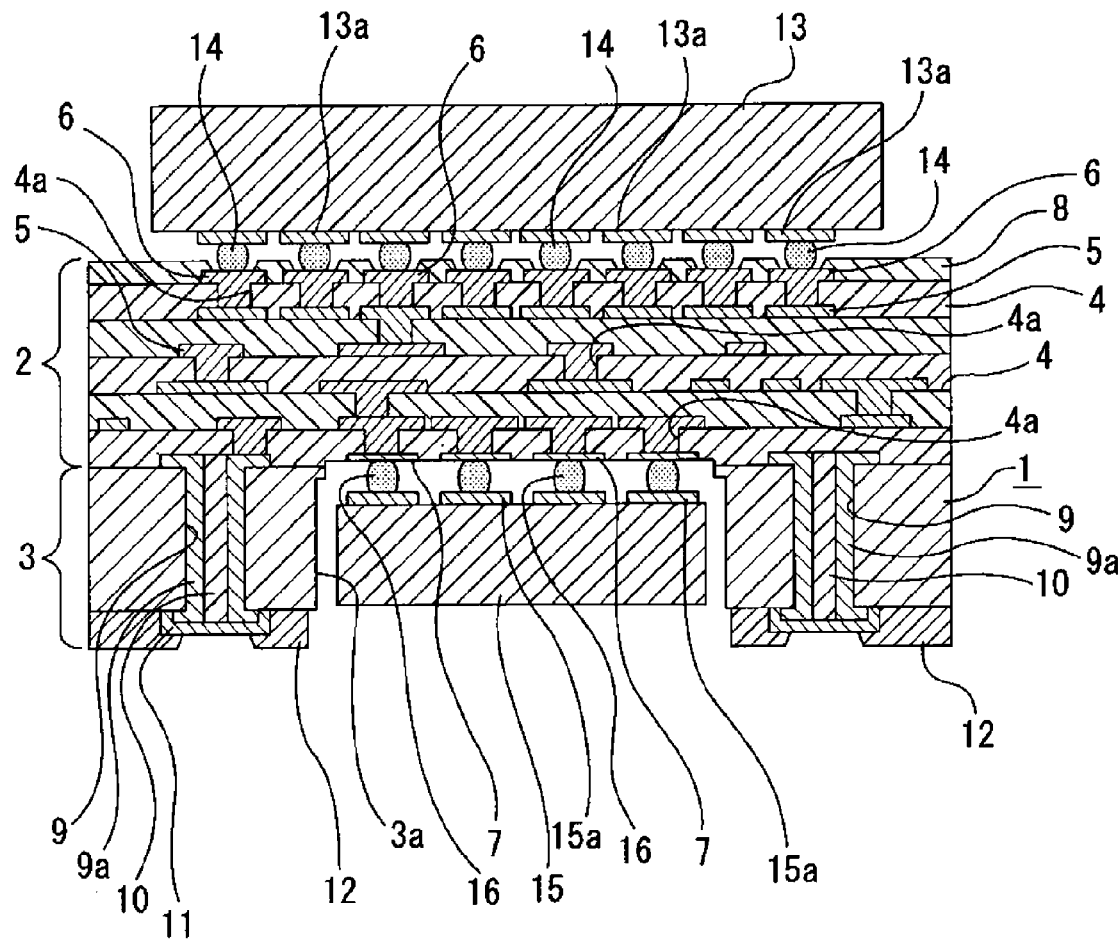
FIG. 11 is an enlarged cross-sectional diagram showing a state in which electronic components are mounted on the wiring board.

Next, the terminal parts 13a of the electronic component 13 are connected to the first terminal connection parts 6 of each stiffener 3 via solders 14, the electronic component 15 is disposed in the component disposition hole 3a of the stiffener 3, and then the terminal parts 15a are connected to the second terminal connection parts 7 via the solders 16 (refer to FIG. 11).

In the wiring board 1, the connection pads 11 formed in the stiffener 3 and 3 are bonded to the connection terminals 100a of the circuit board 100 via the solders 17.

It should be noted that, in the wiring board 1, underfill materials respectively fill the space between the lower face of the electronic component 13 and the top face of the laminate 2 and the space between the top face of the electronic component 15 and the lower face of the laminate 2 to cover the first terminal connection parts 6 and the second terminal connection parts 7. In addition, on the top face of the electronic component 13, a heat dissipation plate that is not shown in the drawing is disposed via a heat transfer material layer, for example, a TIM, so that heat generated from the electronic component 13 is discharged from the heat dissipation plate.

Each wiring board 1 is manufactured using the method in which two stiffeners 3 and 3 are bonded to each other, and the laminates 2 and 2 are formed on the bonded stiffeners 3 and 3 as described above. Thus, the occurrence of warping can be suppressed in the manufacturing process, a plurality of wiring boards 1 can be manufactured in one manufacturing process, and manufacturing cost can be accordingly lowered.

OTHER EXAMPLES

In the above description, the example in which the electronic components 13 and 15 are connected respectively to the first terminal connection parts 6 and the second terminal connection parts 7 of the laminate 2 has been described, but the wiring board 1 may be configured as will be described next.

Figure 12:
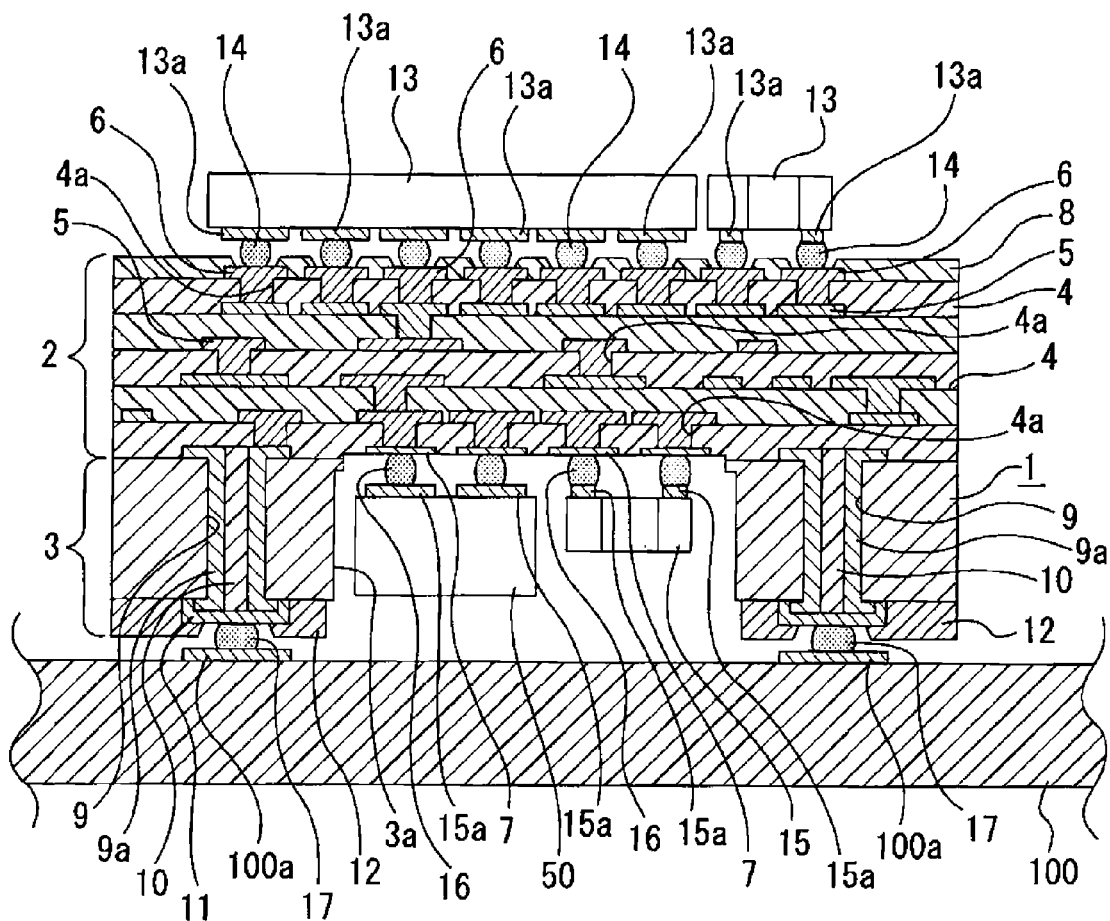
FIG. 12 is an enlarged cross-sectional diagram showing an example in which a plurality of electronic components are connected to first terminal connection parts and second terminal connection parts.

For example, a plurality of electronic components 13 and 15 may be connected respectively to the first terminal connection parts 6 and the second terminal connection parts 7 of the laminate 2 (refer to FIG. 12). In addition, a package component 50 in which the electronic components 13 and 15 are housed in a case or the like so as to be integrated may be connected to the first terminal connection parts 6 and the second terminal connection parts 7.

Figure 13:
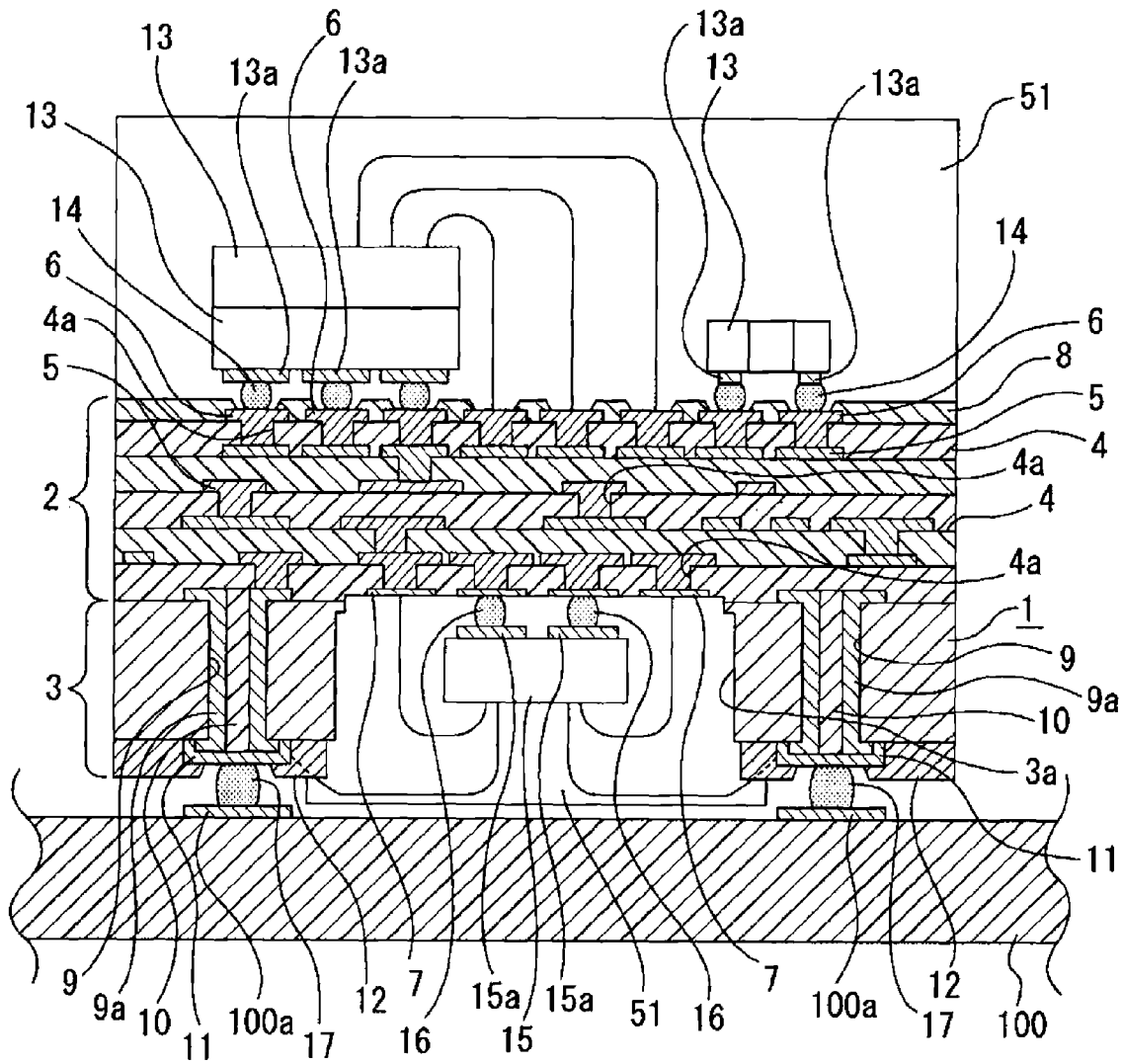
FIG. 13 is an enlarged cross-sectional diagram showing an example in which electronic components are connected to the first terminal connection parts and the second terminal connection parts through wire bonding.

In addition, for example, a single or a plurality of electronic components 13 and 15 may be respectively connected to the first terminal connection parts 6 and the second terminal connection parts 7 of the laminate 2 through wire bonding (refer to FIG. 13). In this case, the plurality of electronic components 13 and 15 may be connected using chip-on-chip or TSV (Through Silicon Via). Furthermore, the electronic components 13 and 15 may be sealed by seal resins 51 and 51.

[Conclusion]

As described above, in the wiring board 1, the plurality of insulating layers 4 and the plurality of wiring layer 5 are laminated on the stiffener 3, and thereby the laminate 2 is formed.

Thus, since it is not necessary to separately form the laminate 2 and the stiffener 3 and bond them, and accordingly, solder or a solder resist is not applied between them, miniaturization (thinning) of the wiring board 1 can be achieved.

In addition, a step of forming a solder resist between the laminate 2 and the stiffener 3 is unnecessary, a step of bonding the laminate 2 and the stiffener 3 using soldering is also unnecessary, and accordingly, reduction of manufacturing cost can be achieved.

Furthermore, since the electronic component 13 and the electronic component 15 are connected to both upper and lower faces of the coreless type laminate 2 that does not have the core, high-speed transmission between the electronic component 13 and the electronic component 15 can be achieved.

Furthermore, since the wiring layer 5 is connected to the conduction part 9a between the laminate 2 and the stiffener 3 without soldering, low resistance and reduction of a voltage loss can be achieved.

In addition, since the laminate body 2 is formed on the stiffener 3 in a laminated manner and coupled therewith without soldering, improvements in strength and reliability can be achieved.

In addition, since the stiffener 3 is formed in a frame shape, the electronic component 15 disposed in the component disposition hole 3a can be protected by the stiffener 3 from the outer side, and an improvement in reliability of operations of the wiring board 1 can be achieved.

Furthermore, since the through holes 9 for connection to the circuit board 100 are formed in the stiffener 3, connection of the laminate 2 and the circuit board 100 can be made simply and reliably.

It should be noted that, since the number of the connection terminals 100a of the circuit board 100 may be less than that of the terminal parts (first terminal connection parts 6) on the electronic component 13 side, and the size of the through holes 9 can be increased while reducing the number thereof, formation of the through holes 9 using a drill can be performed at a low cost.

In addition, since the number of the through holes 9 may be small, miniaturization of the wiring board 1 can accordingly be achieved.

Furthermore, since the size of the through holes 9 is large, the sizes of the conduction parts 9a can accordingly be increased, a delay of a transmission speed between the electronic components 13 and 15 and the circuit board 100 can be avoided, and deterioration of an electric characteristic can be suppressed.

In addition, a coreless board is formed using a method in which insulating layers and wiring layers are laminated on a support having high rigidity, and then the supporting body is discarded after manufacturing, but the wiring board 1 keeps the stiffener 3 functioning as a supporting body even after it is manufactured as a product, and thus losses in natural resources and processes caused by such discarding can be reduced.

[Present Technology]

Additionally, the present technology may also be configured as below.

(1) A wiring board including:
    a stiffener bonded to a circuit board; and
    a laminate formed by laminating a plurality of insulating layers and a plurality of wiring layers on a face of the stiffener opposite to a face bonded to the circuit board,
    wherein, on both faces of the laminate in a laminating direction, terminal connection parts connected to the wiring layers and connected to a terminal part of an electronic component are formed, and
    wherein a component disposition hole, in which the terminal connection parts formed on one of the faces of the laminate are positioned and the electronic component is disposed, and a through hole for connection to the circuit board are formed in the stiffener.

(2) The wiring board according to (1), wherein the stiffener is formed in a frame shape.

(3) A manufacturing method of a wiring board, including:
    bonding two stiffeners in each of which a through hole for connection to a circuit board is formed and between which a bonding material is sandwiched;
    forming laminates by laminating a plurality of insulating layers and a plurality of wiring layers on respective faces of the respective stiffeners opposite to bonded faces, the laminates each having, on both faces in a laminating direction, a terminal connection part connected to the wiring layers and connected to a terminal part of an electronic component;
    separating the two stiffeners from each other and removing the bonding material; and
    separating, from the laminate, part of any of the stiffeners by cutting, and forming a component disposition hole in which the electronic component is disposed.

(4) The manufacturing method of a wiring board according to (3), wherein the stiffeners are each formed in a frame shape.

(5) The manufacturing method of a wiring board according to (3) or (4), wherein a notch is formed on a part of a cut spot that is cut during formation of the component disposition hole in the each of the stiffeners.

(6) The manufacturing method of a wiring board according to any one of (3) to (5), wherein a thermoplastic film is used as the bonding material.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-185689 filed in the Japan Patent Office on Aug. 24, 2012, the entire content of which is hereby incorporated by reference.

What is claimed is:

1. A wiring board comprising:
    a stiffener bonded to a circuit board; and
    a laminate formed by laminating a plurality of insulating layers and a plurality of wiring layers on a face of the stiffener opposite to a face bonded to the circuit board,
    wherein, a first terminal connection part is formed on a first face of the laminate and a second terminal connection part is formed on a second face of the laminate opposite to the first face, the first terminal connection part and the second terminal connection part connected to the wiring layers and connected to terminal parts of respective electronic components, and wherein a component disposition hole, in which the terminal connection part formed on one of the first and second faces of the laminate are positioned and a respective electronic component is disposed, and a through hole for connection to the circuit board are formed in the stiffener.

2. The wiring board according to claim 1, wherein the stiffener is formed in a frame shape.

3. The wiring board according to claim 1, wherein a solder resist is formed on the laminate and covers an outer periphery of the first terminal connection part.

4. The wiring board according to claim 1, wherein the component disposition hole penetrates a center portion of the stiffener.

5. The wiring board according to claim 4, wherein one of the first terminal connection part and the second terminal connection part is positioned in the component disposition hole.

* * * * *